United States Patent
Golovanevsky

(10) Patent No.: US 10,354,035 B2
(45) Date of Patent: Jul. 16, 2019

(54) HOT SPOT AND PROCESS WINDOW MONITORING

(71) Applicant: KLA-Tencor Corporation, Milpitas, CA (US)

(72) Inventor: Boris Golovanevsky, Haifa (IL)

(73) Assignee: KLA-Tencor Corporation, Milpitas, CA (US)

( * ) Notice: Subject to any disclaimer, the term of this patent is extended or adjusted under 35 U.S.C. 154(b) by 142 days.

(21) Appl. No.: 15/509,728

(22) PCT Filed: Jan. 6, 2017

(86) PCT No.: PCT/US2017/012490
§ 371 (c)(1),
(2) Date: Mar. 8, 2017

(87) PCT Pub. No.: WO2017/123464
PCT Pub. Date: Jul. 20, 2017

(65) Prior Publication Data
US 2018/0232478 A1    Aug. 16, 2018

Related U.S. Application Data

(60) Provisional application No. 62/277,274, filed on Jan. 11, 2016.

(51) Int. Cl.
*G06F 17/50* (2006.01)
*G03F 7/20* (2006.01)

(52) U.S. Cl.
CPC ...... *G06F 17/5068* (2013.01); *G03F 7/70508* (2013.01); *G03F 7/70633* (2013.01); *G03F 7/70683* (2013.01)

(58) Field of Classification Search
CPC ............... G03F 7/70633; G03F 9/7076; G03F 7/70641; G03F 7/70408; G03F 7/706;
(Continued)

(56) References Cited

U.S. PATENT DOCUMENTS 6,128,089 A * 10/2000 Ausschnitt .......... G03F 7/70625
250/548
6,884,552 B2 * 4/2005 Mieher ............... G03F 7/70641
356/401
(Continued)

FOREIGN PATENT DOCUMENTS

WO    2009130010    10/2009

OTHER PUBLICATIONS

Jayaram,et al., Effective model-based SRAF placement for full chip 2D layouts, Proc. SPIE 8683, Optical Microlithography XXVI, No. 8630H, 9 pages Apr. 12, 2013.
(Continued)

*Primary Examiner* — Nghia M Doan
(74) *Attorney, Agent, or Firm* — Hodgson Russ LLP

(57) ABSTRACT

Metrology overlay targets are provided, as well as method of monitoring process shortcomings. Targets comprise periodic structures, at least one of which comprising repeating asymmetric elements along a corresponding segmentation direction of the periodic structure. The asymmetry of the elements may be designed in different ways, for example as repeating asymmetric sub-elements along a direction perpendicular to the segmentation direction of the elements. The asymmetry of the sub-elements may be designed in different ways, according to the type of monitored process shortcomings, such as various types of hot spots, line edge shortening, process windows parameters and so forth. Results of the measurements may be used to improve the process and/or increase the accuracy of the metrology measurements.

20 Claims, 7 Drawing Sheets

(58) Field of Classification Search
CPC .. G03F 7/70625; G03F 7/70683; G03F 7/705;
G03F 7/70516; G03F 7/7035; G03F
7/70375; G03F 7/70616; G03F 1/36;
G03F 1/44; G03F 7/0002; G03F 7/0005;
G03F 7/70091; G03F 7/7085
USPC .................................. 716/50–56; 430/5, 30
See application file for complete search history.

(56) References Cited

U.S. PATENT DOCUMENTS

| | | | |
|---|---|---|---|
| 7,557,921 | B1 | 7/2009 | Adel et al. |
| 7,678,513 | B2 * | 3/2010 | Nomura .................... G03F 1/44 |
| | | | 355/55 |
| 2003/0021465 | A1 * | 1/2003 | Adel ................... G03F 7/70633 |
| | | | 382/151 |
| 2007/0111109 | A1 | 5/2007 | Yen et al. |
| 2007/0222088 | A1 | 9/2007 | Smith et al. |
| 2010/0196805 | A1 | 8/2010 | Tan et al. |

OTHER PUBLICATIONS

ISA/KR, International Search Report for PCT/US2017/012490 dated Apr. 10, 2017.

* cited by examiner

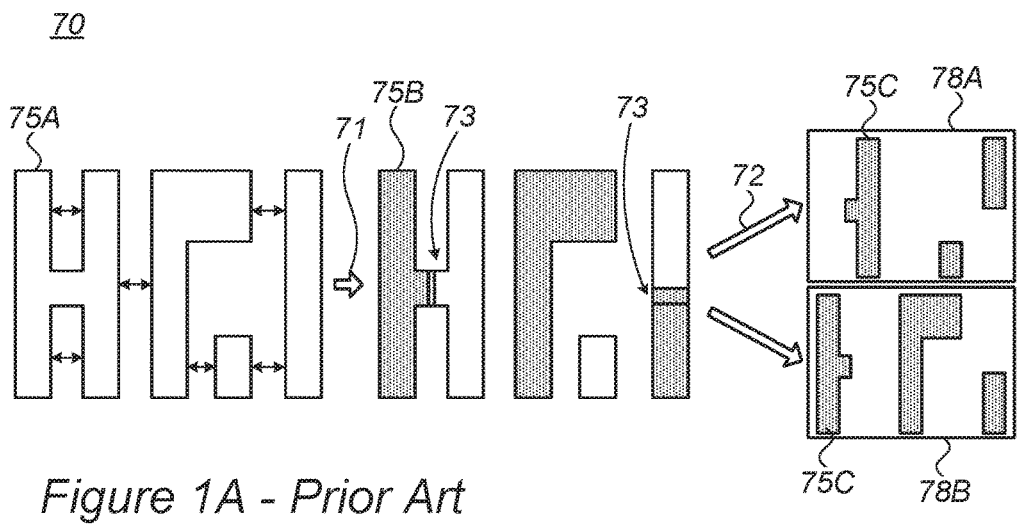
Figure 1A - Prior Art
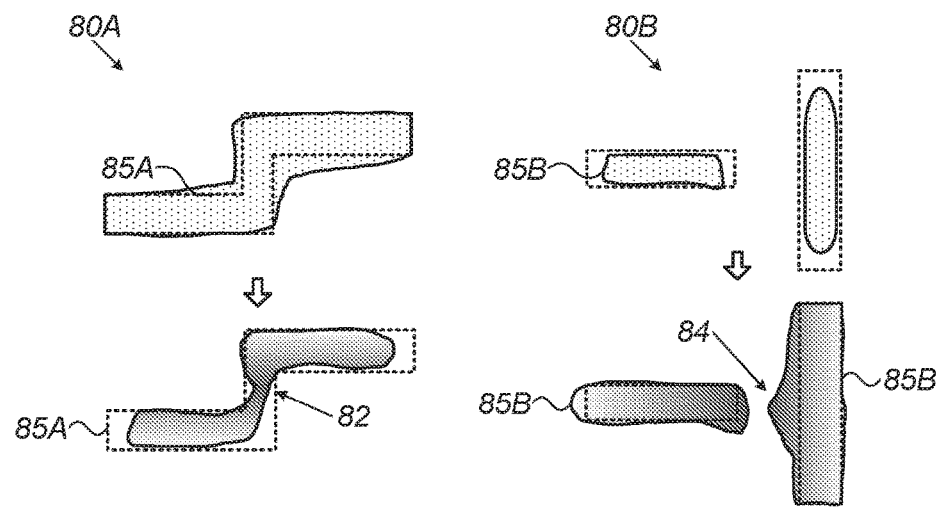
Figure 1B - Prior art

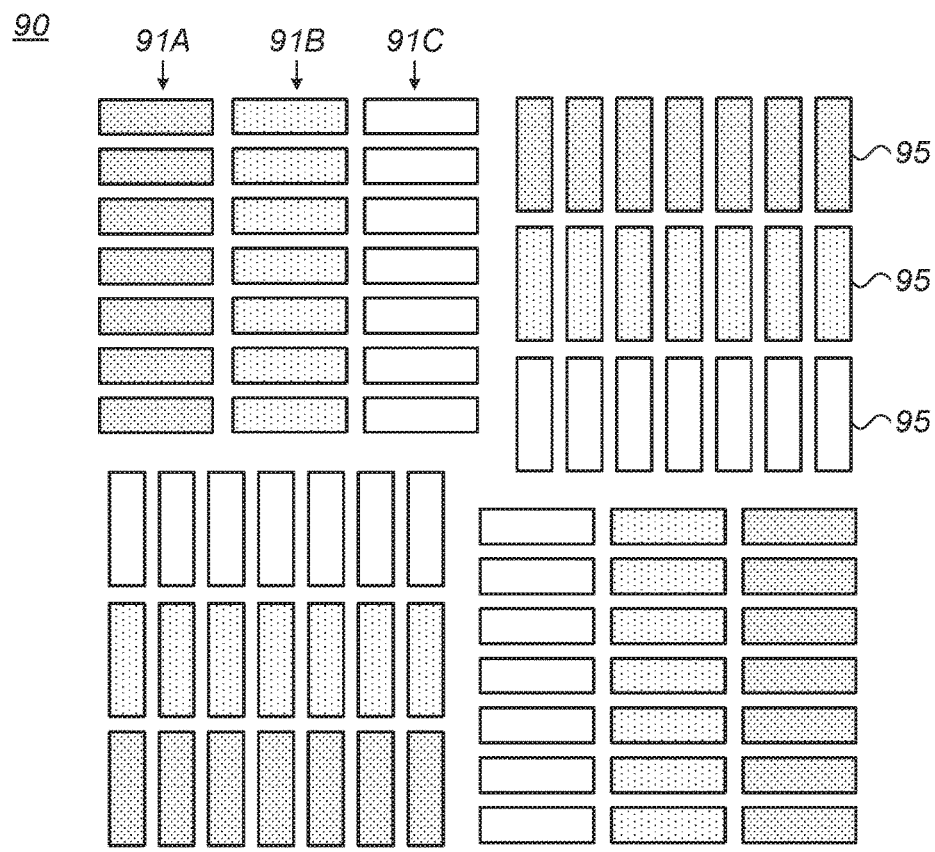
Figure 2 – Prior art
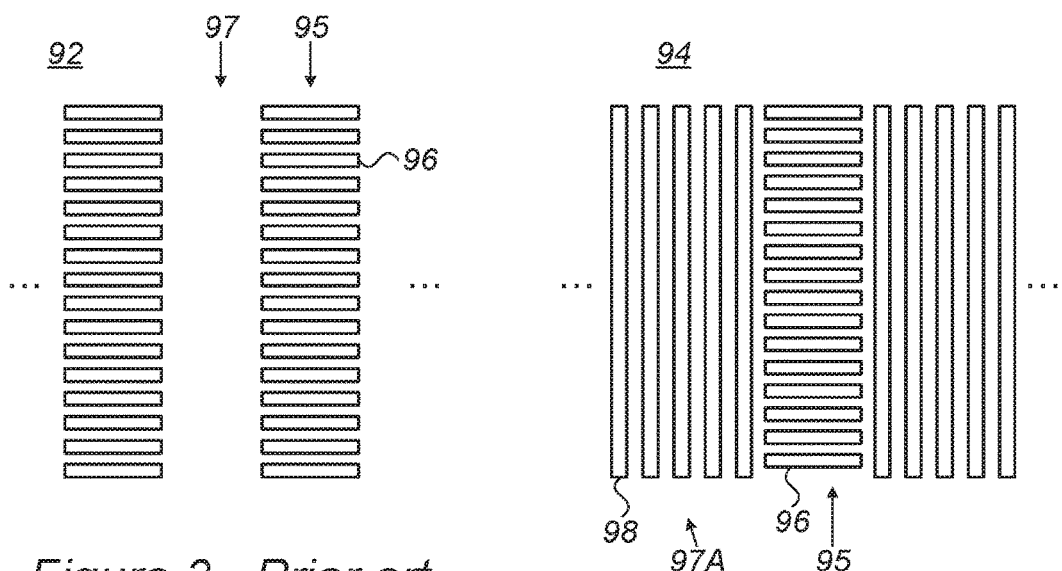
Figure 3 - Prior art

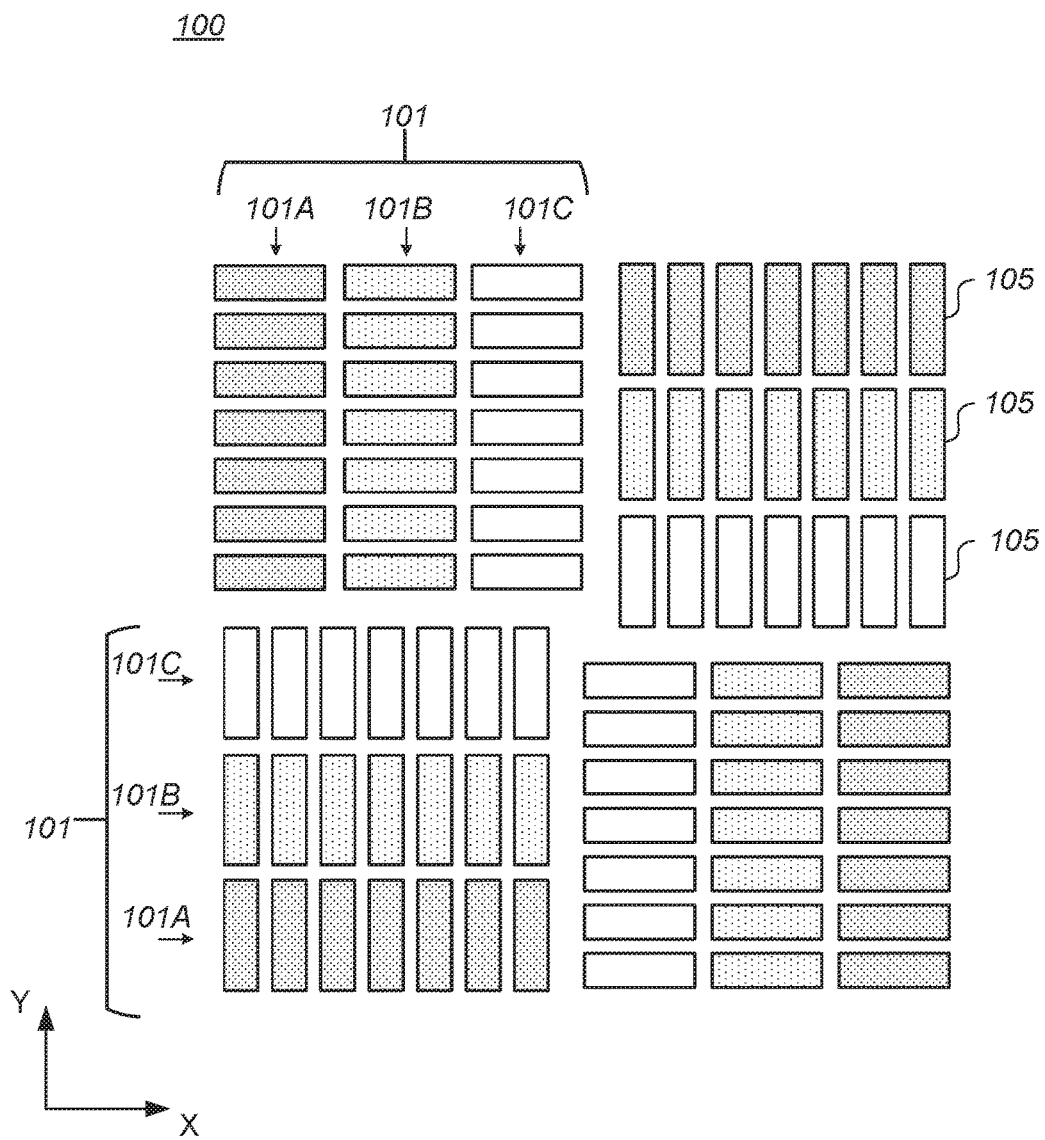
Figure 4 (Cont. 1)

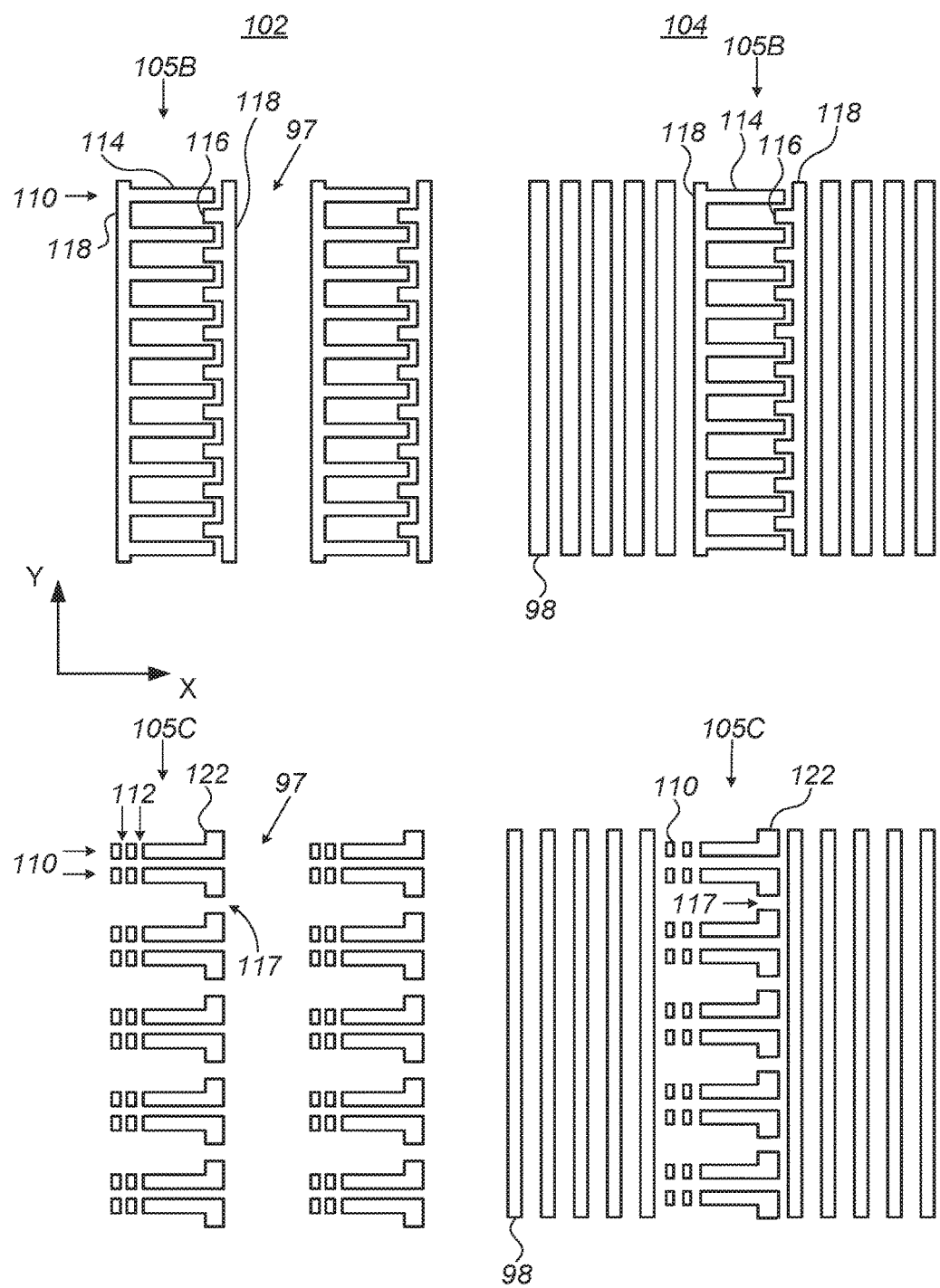
Figure 4 (Cont. 2)

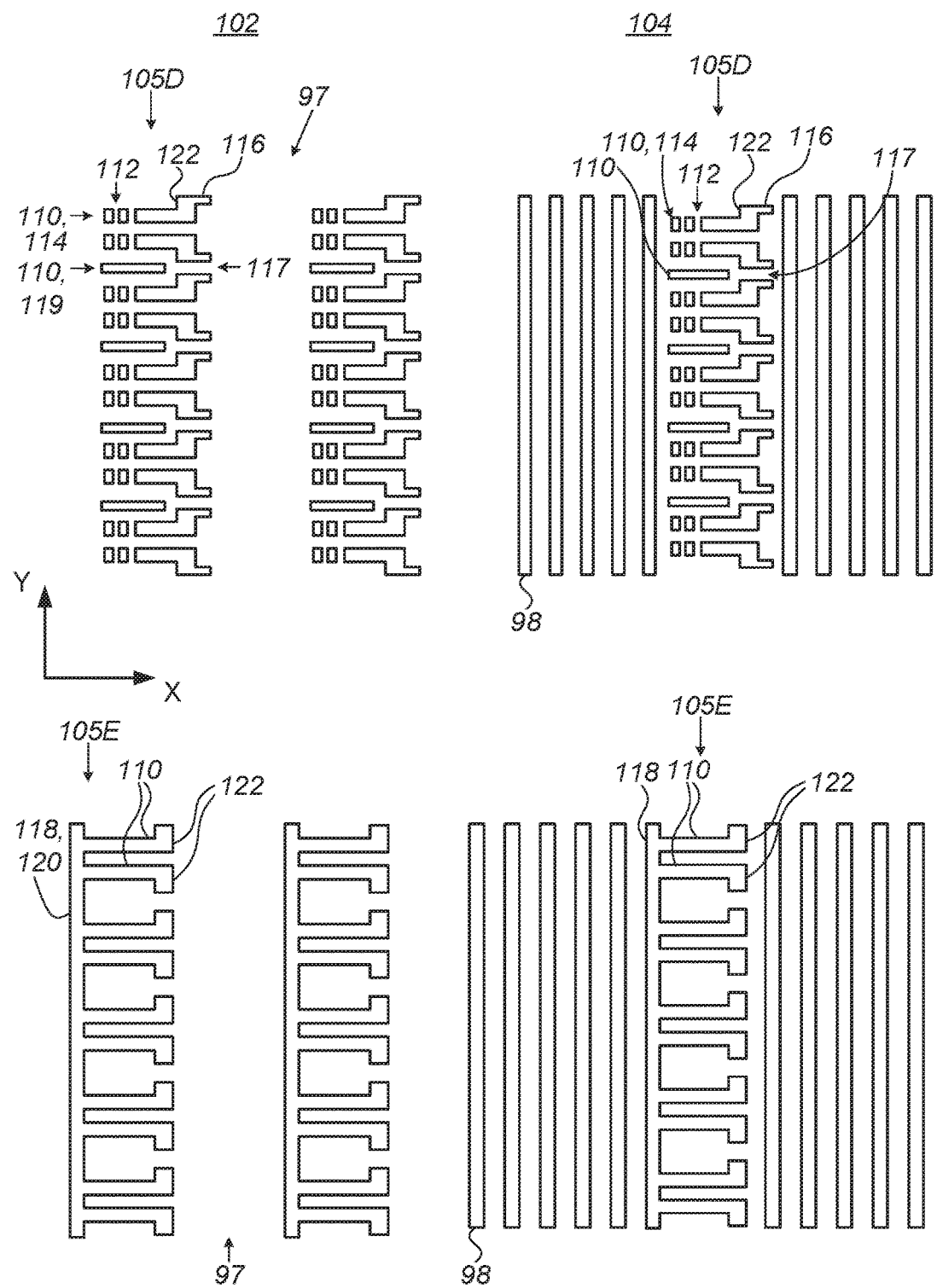
Figure 4 (Cont. 3)

200

- Designing a metrology target as having at least two periodic structures — 210
- Composing at least one of the periodic structures from repeating asymmetric elements along a corresponding segmentation direction of the periodic structure — 220
- Configuring the repeating asymmetric elements to be internally periodic along a direction perpendicular to the segmentation direction — 230
- Composing the repeating asymmetric elements from repeating asymmetric sub-elements along the perpendicular direction — 240
- Configuring the sub-elements to have lines which are broken at least once — 242
- Configuring the sub-elements to have at least two parallel line segments — 244
- Configuring at least some of the parallel line segments to be interconnected — 246
- Introducing vertical lines along the perpendicular direction in at least some of the sub-elements — 250
- Interconnecting at least some of the lines or line segments to at least some of the vertical lines — 252
- Interconnecting sub-elements along the perpendicular direction — 260
- Spacing sub-elements from each other along the perpendicular direction — 270
- Positioning vertical line(s) asymmetrically — 280
- Carrying out the designing by at least one computer processor — 290
- Producing the metrology target — 292
- Deriving metrology signals from the metrology target — 294

Figure 5

HOT SPOT AND PROCESS WINDOW MONITORING

CROSS REFERENCE TO RELATED APPLICATIONS

This application claims the benefit of U.S. Provisional Patent Application No. 62/277,274 filed on Jan. 11, 2016, which is incorporated herein by reference in its entirety.

BACKGROUND OF THE INVENTION

1. Technical Field

The present invention relates to the field of imaging and scatterometry overlay metrology, and more particularly, to monitoring of various process shortcomings in target design and production.

2. Discussion of Related Art

As the technology node shrinks and the lithography wavelength remains at 193 nm, the sub-wavelength gap increases. With this increasing gap, printed-wafer shapes show progressively less similarity to the design-layout shapes, even with optical proximity correction (OPC) and other resolution enhancement techniques (RET). While RET tools have good understanding of this shape infidelity, they have no ability to change the drawn layout. While design tools have more leeway to modify the drawn layout, their understanding of lithography effects is limited, taking the form of design rules that try to prevent "Hot Spots." A Hot Spot is a location that may demonstrate some lithographic-printing problem such as pinching, bridging, or line-end shortening—that result in device failure, or unacceptable shrinking of the process window—as exemplified in FIG. 1B below.

Meanwhile, design rules are becoming increasingly complex and ultimately less useful in addressing the lithography challenges. Moreover, design rules complexity results in the hot spots issue becoming one of the significant yield limiting factors in contemporary multi-patterning process.

A typical mask manufacturing and hotspot management flow starts from design rule clean layout followed by OPC and Model Based Verification (MBV). Although after several iterations of OPC and MBV, the post-OPC layout can pass MBV, it cannot guarantee that there is no defect on the wafer because the model is not perfect, especially when the pattern complexity increases. As a result, after wafer processing, wafer inspection becomes a necessary step for finding the defect locations.

In 20 nm node and beyond (i.e., to smaller nodes), the portion of yield loss due to systematic defects has increased and diversified. Systematic defects may be caused by design complexity and complex advanced OPC, and also by physical failures coming from etching, chemical polishing (CMP) and so on. When marginal structures encounter process variations, resulting patterns may end up as deformed structures, characterized as pinching, bridging, and line-end shortening.

Such phenomena cause the number of hotspots to increase, and much effort is expended to identify and mitigate them. To reduce the occurrence of hotspots and get the productivity with higher yield at the time of mass-production, much effort is invested to predict and eliminate weak design, e.g., using simulations. However, even if the simulation is calibrated for reaching the designer's target, the advanced process in 20 nm node and beyond (to smaller nodes) results in a big difference between the results of the simulation and actual printed pattern on the wafer. This means that the simulators cannot predict the actual defects that occur in actual wafer-process because of less process margin.

Moreover, 2D (two dimensional) design patterns offer a much wider range of combinations of critical features than 1D orientation patterns. The measurement of the distance between two opposite line ends (tip-to-tip) or between a line-end perpendicular to a trench (tip-to-trench) are obtained as function of the process.

FIG. 1A schematically illustrates the splitting of 2D patterns 75A into simpler patterns 75B and further into elements 75C processed using separate masks 78A, 78B, according to the prior art. The multi-patterning schemes split (71) the 2D regions (polygons) into two or more polygons (termed layer decomposition) with stitches 73 and further splits (72) the structures to separated masks for processing (e.g., by double patterning, such as LELE—litho etch litho etch). Such schemes are very sensitive to OVL error and process variation, and massively increase the significance of hot spots.

FIG. 1B schematically illustrates Hot Spots behavior in conjunction with the process window, according to the prior art. Illustrations 80A, 80B show schematically two non-limiting examples of hotspots, in a process corner and a process gap, respectively, having a necking hotspot 82 and a bridging hotspot 84, respectively, as non-limiting examples of the prior art.

SUMMARY OF THE INVENTION

The following is a simplified summary providing an initial understanding of the invention. The summary does not necessarily identify key elements nor limits the scope of the invention, but merely serves as an introduction to the following description.

One aspect of the present invention provides overlay metrology targets comprising at least two periodic structures, wherein at least one of the periodic structures comprises repeating asymmetric elements along a corresponding segmentation direction of the periodic structure.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings:

FIG. 1A schematically illustrates the splitting of 2D patterns into simpler patterns and further into elements processed using separate masks according to the prior art.

FIG. 1B schematically illustrates Hot Spots behavior in conjunction with the process window, according to the prior art.

FIG. 2 is a schematic illustration of periodic structures of an imaging target, according to the prior art.

FIG. 3 is a high level schematic illustration of elements of periodic structures in the imaging target, according to the prior art.

FIG. 5 is a high level flowchart illustrating a method, according to some embodiments of the invention.

DETAILED DESCRIPTION OF THE INVENTION

Figure 4:
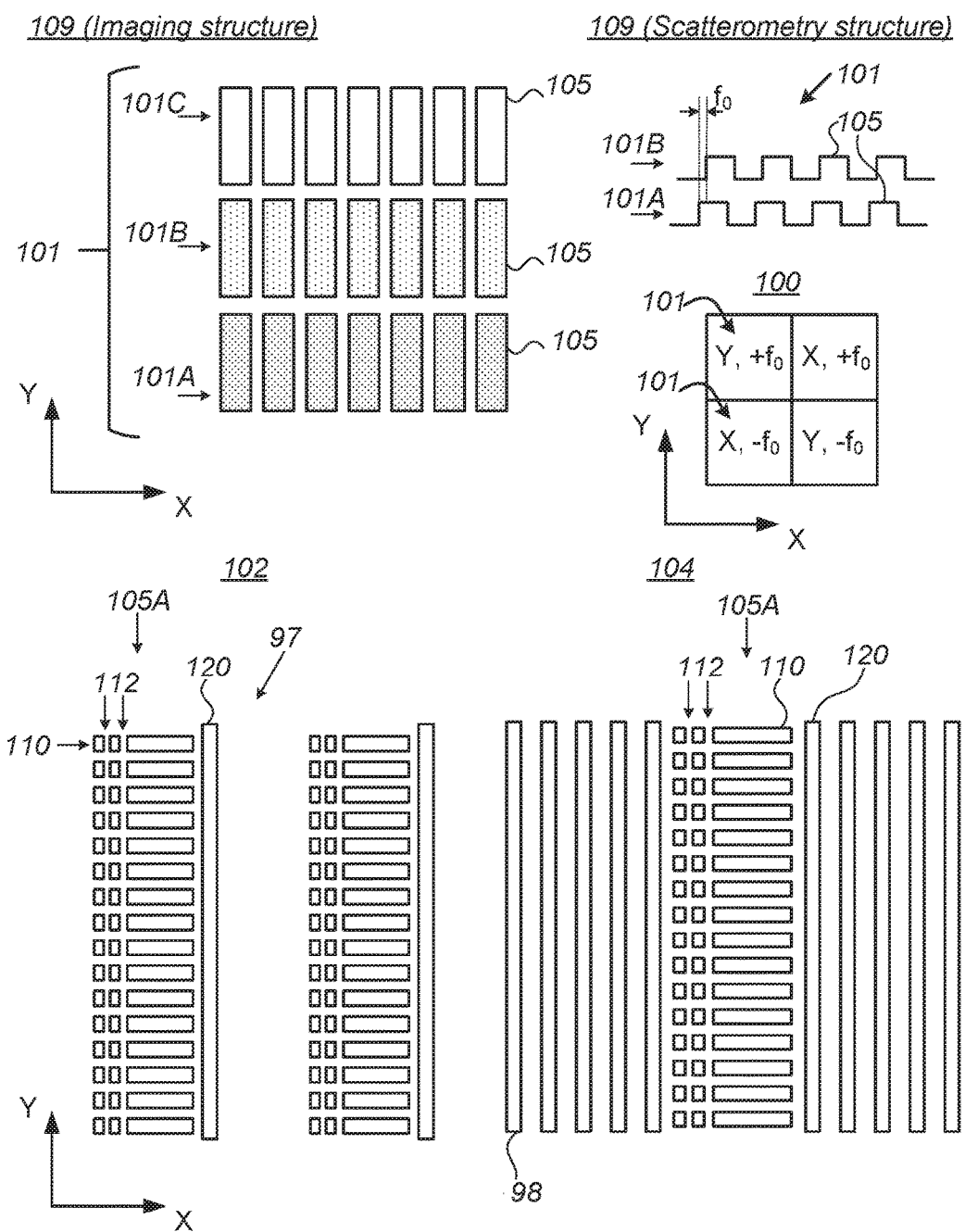
FIG. 4 is a schematic illustration of periodic structures in overlay targets and parts thereof as well as various exemplary, non-limiting element designs for elements of the periodic structures of overlay targets, according to some embodiments of the invention.

In the following description, various aspects of the present invention are described. For purposes of explanation, specific configurations and details are set forth in order to provide a thorough understanding of the present invention. However, it will also be apparent to one skilled in the art that the present invention may be practiced without the specific details presented herein. Furthermore, well known features may have been omitted or simplified in order not to obscure the present invention. With specific reference to the drawings, it is stressed that the particulars shown are by way of example and for purposes of illustrative discussion of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments that may be practiced or carried out in various ways as well as to combinations of the disclosed embodiments. Also, it is to be understood that the phraseology and terminology employed herein is for the purpose of description and should not be regarded as limiting.

Unless specifically stated otherwise, as apparent from the following discussions, it is appreciated that throughout the specification discussions utilizing terms such as "processing", "computing", "calculating", "determining", "enhancing" or the like, refer to the action and/or processes of a computer or computing system, or similar electronic computing device, that manipulates and/or transforms data represented as physical, such as electronic, quantities within the computing system's registers and/or memories into other data similarly represented as physical quantities within the computing system's memories, registers or other such information storage, transmission or display devices.

While the disclosed invention is applicable to both imaging and scatterometry overlay targets, target design examples presented herein are related to imaging technology, in a non-limiting manner. A similar approach may be used to design scatterometry targets.

The optical resolution of the overlay (OVL) imaging tool is relatively low and requires using micron level features as resolvable elements of overlay targets. However, non-imaging or non-resolving techniques (e.g., scatterometry) impose similar implication to the target design. These "big" features are not compatible with the contemporary process design rules and require corresponding segmentation/dummification (e.g., using sub-elements at a smaller scale to fill in target elements of "bigger", micron scale, which usually form a periodic pattern, see FIG. 3). The proper segmentation brings the overlay target behavior closer to device behavior. However, the orthogonal line segmentation (see a non-limiting illustration in FIG. 3, 96) suffers from the Line End Shortening (LES) similar to device, and in case of asymmetric LES due to lithography optics aberration or off-axis illumination this LES could impact the overlay measurement. Moreover, the parallel line segmentation (see a non-limiting illustration in FIG. 3, 98) suffers from a kind of PPE (Pattern Placement Error) where the outer lines width in the segmented bar have is different from the width of inner lines.

FIG. 2 is a schematic illustration of periodic structures of an advanced imaging target 90, according to the prior art. In prior art imaging targets 90 (e.g., AIM target—Advanced Imaging Metrology target) able to measure OVL for more than two layers. The presented example of AIM target includes periodic structures 91A, 91B, 91C. The AIM target usually includes blocks responsible for OVL measurement for both X and Y directions. The example on FIG. 2 has two blocks for each direction with clockwise symmetry. They are typically designed in an outer, a middle and an inner layer, respectively, which are different layers in the wafer, such as two previously produced layers and a resist layer. Periodic structures 91A, 91B, 91C are composed of elements 95 which may be similar or differ from each other in different periodic structures 91A, 91B, 91C according to DR (Design Role) requirements relevant to a specific layer. FIG. 3 is a high level schematic illustration of elements 95 of periodic structures 91A, 91B, 91C in imaging target 90, according to the prior art. Elements 95 are typically segmented bars with sub-elements 96 forming the segmentation of elements 95, and spaces 97 being left empty (as in design 92) or being filled with segmented dummification designs 97A (as in design 94) with sub-elements 98. The segmentation of the bar 95 could be orthogonal 96 or parallel 98. In both prior art cases, sub-elements 96, 98 are symmetric bars.

Embodiments of the present invention provide efficient and economical methods of converting the "big" target features and using specially designed targets to monitor hot spots like LES together with overlay (or separately therefrom) and decrease the number of required CD-SEM (critical dimension scanning electron microscopy) measurements, which are the prior art way of studying LES and hotspots.

Certain embodiments comprise using OVL tools and OVL algorithms with specially designed target to monitor hot spots and/or the process window. Advantageously, with respect to prior art using CD-SEM-like tools for hot spots in-line detection and monitoring, which have a very low throughput and a high tool Cost of Ownership (CoO), disclosed methods and targets provide effective hot spots monitoring which leads to yield improvement. In addition, combining the hot spot monitoring and OVL measurement allows to improve the wafer measurement throughput and wafer real estate.

Metrology imaging targets are provided as a non-limiting example, as well as methods of monitoring process shortcomings. Targets comprise periodic structures, at least one of which comprising repeating asymmetric elements along a corresponding segmentation direction of the periodic structure. The asymmetry of the elements may be designed in different ways, for example as repeating asymmetric sub-elements along a direction perpendicular to the segmentation direction of the elements. The asymmetry of the sub-elements may be designed in different ways, according to the type of monitored process shortcomings, such as various types of hot spots, line edge shortening, process windows parameters and so forth. Results of the measurements may be used to improve the process and/or increase the accuracy of the metrology measurements.

FIG. 4 is a schematic illustration of periodic structures 101 in overlay targets 100 and in parts 109 thereof as well as various exemplary, non-limiting element designs 105A-105E for elements 105 of periodic structures 101 of overlay targets 100, according to some embodiments of the invention. Overlay targets 100 may comprise imaging targets 100 and/or scatterometry targets 100, with multiple illustrated parts 109, which may be arranged in various layouts, e.g., in a similar configuration to imaging target 90 of FIG. 2 or in other configurations. Any designs of imaging and scatterometry targets may employ periodic structures as disclosed herein, the schematic illustrations are not limiting the embodiments of the invention. Any of the illustrated periodic structures may be part of imaging or scatterometry overlay targets 100. At least one of periodic structures 101A, 101B, 101C may be composed of elements 105 which may be similar or differ from each other in different periodic structures 101A, 101B, 101C. Periodic structures 101A, 101B, 101C may be designed in different layers and/or with respect to different process steps, for example, periodic structures 101A, 101B, 101C may be at (i) a desired process layer used for overlay measurement, (ii) an anchor same resist layer with segmentation for LES monitoring (e.g., any of 105A-105E or equivalent designs) and (iii) the anchor resist layer (without segmentation). Any number of different periodic structures 101 may be designed in imaging and/or scatterometry overlay targets 100 (two, three, four, or more periodic structures 101) and the design details of elements 105 may be selected according to the purpose of measurement, e.g., LES, hot spots of different types (see above) and additional purposes described below, possible in combination with overlay measurements.

The target segmentation, namely the segmentation of elements 105, may be designed as repeatable pattern(s) of device-like structures. These structures may be way below the optical resolution of the overlay imaging tool and may be designed in a way that the segmented bar (edges or center of mass) moves as a result of LES effect (or other desired type of hot spot for monitoring)—thus indicating the existence and possible extent of LES and/or hotspots.

FIG. 4 schematically exemplifies various such patterns 105A-105E in a non-limiting manner. The illustrated examples are applicable both to parts 109 of the OVL target responsible for OVL measurement in the X direction (according to the illustrated directionality), as well as to parts 109 of the OVL target responsible for OVL measurement in the Y direction, which may be e.g., created by rotation the example by 90°. Each demonstration includes an example 102 with gaps 97 between respective elements 105A-105E and an example 104 illustrating a bar with parallel segmentation 98 between respective elements 105A-105E. Segmented bar 98 may be used as fill-in dummification, as an anchor bar or as any other functional part of the measurement target. The parallel bar segmentation was chosen for this example for visualization only, and may be designed differently, based on the required bar functionality and design rules for the specific layer. The bar may even be an unsegmented bar or a bar which is segmented asymmetrically.

Elements 105 (exemplified in a non-limiting manner by a bar) may be segmented, repeating and asymmetric along a corresponding measurement direction (denoted in FIG. 4 as "Y") of structures 101A, 101B and/or 101C. Repeating asymmetric elements 105 may be internally segmented along a direction (denoted in FIG. 4 as "Y") that is perpendicular to the measurement (repeating) direction. Repeating asymmetric elements 105 may comprise repeating sub-elements 110 along the perpendicular direction (Y), the sub-elements being asymmetric in the segmentation direction (X), as illustrated in exemplary designs 105A-105E.

In certain embodiments, sub-elements 110 may comprise lines which are broken at least once, as illustrated in designs 105A, 105C and 105D by gaps 112. Sub-elements 110 may comprise any OPC feature for designs of sub-elements 110 which reduce PPE of one side of sub-elements 110, whereas the opposite side of the sub-elements 110 may be a simple line or include a features designed to monitor the desired hot spots.

In certain embodiments, sub-elements 110 may comprise at least two parallel line segments, as illustrated in designs 105B-105E, e.g., by unequal lines 114, 116 in 105B, unequal lines 114, 116 in 105D and lines 110 in 105C, 105E having equal lengths.

In certain embodiments, at least some of the parallel line segments may be interconnected, as illustrated in design 105D by line segments 114, 116, and in designs 105B and 105E, via interconnecting lines 118.

In certain embodiments, at least some of sub-elements 110 may comprise vertical lines 122 along the perpendicular direction (Y), as illustrated in designs 105C, 105D and 105E.

In certain embodiments, at least some of lines 110 and/or line segments 114, 116, 119 may be interconnected to at least some of vertical lines 122, as exemplified in design 105C.

In certain embodiments, at least some of sub-elements 110 may be interconnected along the perpendicular direction (Y), as illustrated e.g., in designs 105B and 105E.

In certain embodiments, sub-elements 110 may be spaced from each other (see spaces 117) along the perpendicular direction (Y), as illustrated e.g., in designs 105A, 105C and 105D.

In certain embodiments, asymmetric elements 105 may comprise at least one line 120 which is asymmetrically positioned perpendicularly to segmentation direction (X). For example, in design 105A a single vertical line 120 (extending along perpendicular direction Y) is shown, and in design 105E line 118 is positioned similarly. The features' dimensions (mainly CD) depend on the design rules for the specific layer and may vary between the minimum allowed by the process (e.g., 7 nm for the current most advanced process) up to the maximum allowed by the process (e.g., 300 nm in non-limiting examples), and take into account forbidden pitches.

It is explicitly noted that the numeral used to indicate types of design characteristics are not mutually exclusive, and certain design features may implement more than one of the design principles described above. Moreover, elements from different designs 105A-105E may be combined to yield additional designs, and different designs according to the above listed principles and likewise considered part of the present invention. Elements from designs 105A-105E may be combined in any operable combination, and the illustration of certain elements in certain figures and not in others merely serves an explanatory purpose and is non-limiting.

Certain embodiments comprise scatterometry overlay target having at least one period structure with elements 105 having any of the disclosed design patterns.

Certain embodiments comprise target design files of targets 100 as well as metrology signals measured from any of targets 100 (the full target design being composed of multiple target elements 105 according to various patterns, see e.g. prior art target pattern 90).

Modifications to the element designs may be made in order to measure Pattern Placement Error (PPE). Different feature shapes, sizes, pitches, and line to space ratios have different PPEs and may be designed in sub-elements 110 to provide PPE measurements.

In certain embodiments, targets 100 (and target designs derived therefrom) may be designed to enable monitoring of any type of hot spots as well as to monitor the process window in any of the processing steps, such as etch and CMP, in addition to the lithography step.

In certain embodiments, targets 100 (and target designs derived therefrom) may be used to improve the accuracy of overlay measurement by measuring asymmetric LES, PPE or CMP effect and subtracting from the overlay results.

Advantageously, the disclosed 2D patterns offer a much wider combination of critical features with respect to the single orientation pattern. The measurement of the distance between two opposite line ends (tip-to-tip) or between a line-end perpendicular to a trench (tip-to-trench) may be obtained as function of the process.

The target designs may be optimized using any lithography simulation software that propagates the target image up to the imaging device of the overlay tool, possibly simulation tools that provide complete target simulation and overlay tool setup optimization.

Advantageously, the disclosed invention may utilize the standard overlay tool and algorithm without any significant impact on wafer real estate and CoO. Due to high throughput, simplicity of use and short time to results, the disclosed invention may provide a significant increase of hot spots sampling and thus better process monitoring.

FIG. 5 is a high level flowchart illustrating a method 200, according to some embodiments of the invention. The method stages may be carried out with respect to targets 100 described above, which may optionally be designed method 200. Method 200 may be at least partially implemented by at least one computer processor (not shown), e.g., in a target design module (not shown). Certain embodiments comprise computer program products comprising a computer readable storage medium having computer readable program embodied therewith and configured to carry out the relevant stages of method 200. Certain embodiments comprise target design files of respective targets designed by embodiments of method 200. Certain embodiments comprise signals measured from targets 100 and/or targets designed by embodiments of method 200. Method 200 may include designing targets 100 by lithographic simulations and further comprise optimizing the target designs.

Method 200 may comprise designing a metrology imaging target as having at least two periodic structures (stage 210) and composing at least one of the periodic structures from repeating asymmetric elements along a corresponding segmentation direction of the periodic structure (stage 220).

Method 200 may comprise configuring the repeating asymmetric elements to be periodic along a direction perpendicular to the segmentation direction (stage 230) and possibly composing the repeating asymmetric elements from repeating asymmetric sub-elements along the perpendicular direction (stage 240).

Method 200 may comprise any of the following: configuring the sub-elements to have lines which are broken at least once (stage 242), configuring the sub-elements to have at least two parallel line segments (stage 244), configuring at least some of the parallel line segments to be interconnected (stage 246), introducing vertical lines along the perpendicular direction in at least some of the sub-elements (stage 250), and interconnecting at least some of the lines or line segments to at least some of the vertical lines (stage 252).

Method 200 may comprise interconnecting at least some of the sub-elements along the perpendicular direction (stage 260) and/or spacing at least some of the sub-elements from each other along the perpendicular direction (stage 270).

Method 200 may comprise positioning vertical line(s) asymmetrically-asymmetrically positioning at least one line which is perpendicular to the segmentation direction (stage 280).

Method 200 may comprise carrying out designing 210 by at least one computer processor (stage 290) and/or producing the metrology imaging target (stage 292) and/or deriving metrology signals from the metrology imaging target (stage 294).

Aspects of the present invention are described above with reference to flowchart illustrations and/or portion diagrams of methods, apparatus (systems) and computer program products according to embodiments of the invention. It will be understood that each portion of the flowchart illustrations and/or portion diagrams, and combinations of portions in the flowchart illustrations and/or portion diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or portion diagram or portions thereof.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or portion diagram or portions thereof.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or portion diagram or portions thereof.

The aforementioned flowchart and diagrams illustrate the architecture, functionality, and operation of possible implementations of systems, methods and computer program products according to various embodiments of the present invention. In this regard, each portion in the flowchart or portion diagrams may represent a module, segment, or portion of code, which comprises one or more executable instructions for implementing the specified logical function(s). It should also be noted that, in some alternative implementations, the functions noted in the portion may occur out of the order noted in the figures. For example, two portions shown in succession may, in fact, be executed substantially concurrently, or the portions may sometimes be executed in the reverse order, depending upon the functionality involved. It will also be noted that each portion of the portion diagrams and/or flowchart illustration, and combinations of portions in the portion diagrams and/or flowchart illustration, can be implemented by special purpose hardware-based systems that perform the specified functions or acts, or combinations of special purpose hardware and computer instructions.

In the above description, an embodiment is an example or implementation of the invention. The various appearances of "one embodiment", "an embodiment", "certain embodiments" or "some embodiments" do not necessarily all refer to the same embodiments. Although various features of the invention may be described in the context of a single embodiment, the features may also be provided separately or in any suitable combination. Conversely, although the invention may be described herein in the context of separate embodiments for clarity, the invention may also be implemented in a single embodiment. Certain embodiments of the invention may include features from different embodiments disclosed above, and certain embodiments may incorporate elements from other embodiments disclosed above. The disclosure of elements of the invention in the context of a specific embodiment is not to be taken as limiting their use in the specific embodiment alone. Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described. Meanings of technical and scientific terms used herein are to be commonly understood as by one of ordinary skill in the art to which the invention belongs, unless otherwise defined. While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

What is claimed is:

1. A metrology overlay target comprising:
   a wafer; and
   at least two periodic structures disposed on the wafer, wherein at least one of the periodic structures comprises repeating asymmetric elements along a corresponding segmentation direction of the periodic structure, wherein the repeating asymmetric elements are internally periodic along a direction perpendicular to the segmentation direction, wherein the repeating asymmetric elements comprise repeating sub-elements along the perpendicular direction, the sub-elements being asymmetric in the segmentation direction, wherein the sub-elements comprise lines which are broken at least once, and wherein at least some of the sub-elements comprise vertical lines along the perpendicular direction connected to the sub-elements.

2. The metrology overlay target of claim 1, wherein the sub-elements comprise at least two parallel line segments.

3. The metrology overlay target of claim 2, wherein at least some of the parallel line segments are interconnected.

4. The metrology overlay target of claim 1, wherein at least some of the lines or line segments are interconnected to at least some of the vertical lines.

5. The metrology overlay target of claim 1, wherein at least some of the sub-elements are interconnected along the perpendicular direction.

6. The metrology overlay target of claim 1, wherein at least some of the sub-elements are spaced from each other along the perpendicular direction.

7. The metrology overlay target of claim 1, wherein the asymmetric elements comprise at least one asymmetrically positioned line which is perpendicular to the segmentation direction.

8. The metrology overlay target of claim 1, wherein at least one of the sub-elements is a polygon with at least six sides.

9. A method comprising:
   designing a metrology overlay target as having at least two periodic structures, wherein the designing is carried out by at least one computer processor,
   composing, using the at least one computer processor, at least one of the periodic structures from repeating asymmetric elements along a corresponding segmentation direction of the periodic structure,
   configuring, using the at least one computer processor, the repeating asymmetric elements to be internally periodic along a direction perpendicular to the segmentation direction,
   configuring, using the at least one computer processor, the repeating asymmetric elements to have repeating sub-elements along the perpendicular direction, the sub-elements being asymmetric in the segmentation direction,
   configuring, using the at least one computer processor, the sub-elements to have lines which are broken at least once,
   introducing, using the at least one computer processor, vertical lines along the perpendicular direction in at least some of the sub-elements, wherein the vertical lines are connected to the sub-elements, and
   producing the metrology overlay target with the at least two periodic structures on a wafer.

10. The method of claim 9, further comprising configuring, using the at least one computer processor, the sub-elements to have at least two parallel line segments.

11. The method of claim 10, further comprising configuring, using the at least one computer processor, at least some of the parallel line segments to be interconnected.

12. The method of claim 9, further comprising interconnecting at least some of the lines or line segments to at least some of the vertical lines.

13. The method of claim 9, further comprising interconnecting at least some of the sub-elements along the perpendicular direction.

14. The method of claim 9, further comprising spacing at least some of the sub-elements from each other along the perpendicular direction.

15. The method of claim 9, further comprising asymmetrically positioning, using the at least one computer processor, at least one line which is perpendicular to the segmentation direction.

16. The method of claim 9, further comprising configuring at least one of the sub-elements to be a polygon with at least six sides.

17. A metrology scatterometry overlay target comprising:
a wafer; and
at least two periodic structures disposed on the wafer, wherein at least one of the periodic structures comprises repeating asymmetric elements along a corresponding segmentation direction of the periodic structure wherein the repeating asymmetric elements are internally periodic along a direction perpendicular to the segmentation direction, wherein the repeating asymmetric elements comprise repeating sub-elements along the perpendicular direction, the sub-elements being asymmetric in the segmentation direction, wherein the sub-elements comprise lines which are broken at least once, and, wherein at least some of the sub-elements comprise vertical lines along the perpendicular direction connected to the sub-elements.

18. The metrology scatterometry overlay target of claim 17, wherein at least one of the sub-elements is a polygon with at least six sides.

19. A metrology imaging overlay target comprising:
a wafer; and
at least two periodic structures disposed on the wafer, wherein at least one of the periodic structures comprises repeating asymmetric elements along a corresponding segmentation direction of the periodic structure wherein the repeating asymmetric elements are internally periodic along a direction perpendicular to the segmentation direction, wherein the repeating asymmetric elements comprise repeating sub-elements along the perpendicular direction, the sub-elements being asymmetric in the segmentation direction, wherein the sub-elements comprise lines which are broken at least once, and, wherein at least some of the sub-elements comprise vertical lines along the perpendicular direction connected to the sub-elements.

20. The metrology imaging overlay target of claim 19, wherein at least one of the sub-elements is a polygon with at least six sides.

* * * * *